(12) United States Patent
Wang et al.

(10) Patent No.: US 11,255,906 B2
(45) Date of Patent: Feb. 22, 2022

(54) TEST DEVICE AND METHOD WITH BUILT-IN SELF-TEST LOGIC

(71) Applicant: MONTAGE TECHNOLOGY CO., LTD., Shanghai (CN)

(72) Inventors: Dan Wang, Shanghai (CN); Ranran Fan, Shanghai (CN); Xiao Zhu, Shanghai (CN); Zhongyuan Chang, Shanghai (CN); Xin Liu, Shanghai (CN)

(73) Assignee: MONTAGE TECHNOLOGY CO., LTD., Shanghai (CN)

( * ) Notice: Subject to any disclaimer, the term of this patent is extended or adjusted under 35 U.S.C. 154(b) by 0 days.

(21) Appl. No.: 17/021,638

(22) Filed: Sep. 15, 2020

(65) Prior Publication Data

US 2021/0173005 A1 Jun. 10, 2021

(30) Foreign Application Priority Data

Dec. 6, 2019 (CN) .......................... 201911241938.1

(51) Int. Cl.
*G01R 31/00* (2006.01)
*G01R 31/3177* (2006.01)
*G01R 31/317* (2006.01)

(52) U.S. Cl.
CPC ... *G01R 31/3177* (2013.01); *G01R 31/31724* (2013.01)

(58) Field of Classification Search
None
See application file for complete search history.

(56) References Cited

U.S. PATENT DOCUMENTS

| 6,260,167 | B1* | 7/2001 | Lo | H04L 43/50 |
| | | | | 714/735 |
| 2007/0160213 | A1* | 7/2007 | Un | H04W 12/041 |
| | | | | 380/270 |
| 2007/0168770 | A1* | 7/2007 | Fan | H04L 1/243 |
| | | | | 714/704 |
| 2008/0114562 | A1* | 5/2008 | Sul | H04L 1/245 |
| | | | | 702/122 |

(Continued)

OTHER PUBLICATIONS

R. R. R. Bodha, S. Sarafi, A. Kale, M. Koberle and J. Sturm, "A Half-Rate Built-In Self-Test for High-Speed Serial Interface using a PRBS Generator and Checker," 2019 Austrochip Workshop on Microelectronics (Austrochip), 2019, pp. 43-46, doi: 10.1109/Austrochip.2019.00019. (Year: 2019).*

(Continued)

*Primary Examiner* — Daniel F. McMahon
(74) *Attorney, Agent, or Firm* — Oliff PLC

(57) ABSTRACT

A test device and method with built-in self-test logic and a communication device. The test device includes at least one generator and at least one checker which are disposed between a physical layer and a medium access control layer. The at least one generator is configured to generate a protocol pattern to form a data path between the physical layer and the medium access control layer, and generate different pseudo random bit sequence patterns in the data path. The at least one checker is configured to test a data stream in the physical layer and/or the medium access control layer according to the pseudo random bit sequence patterns, thereby locating a fault position.

12 Claims, 3 Drawing Sheets

(56) References Cited

U.S. PATENT DOCUMENTS

| | | | |
|---|---|---|---|
| 2008/0186887 A1* | 8/2008 | Chapyzhenka | G06F 15/7867 370/310 |
| 2009/0074009 A1* | 3/2009 | Kuliner | H04L 47/14 370/474 |
| 2011/0004793 A1* | 1/2011 | Sul | G01R 31/319 714/718 |
| 2015/0278138 A1* | 10/2015 | Seidel | G06F 13/405 714/800 |

OTHER PUBLICATIONS

A. W. Moore, L. B. James, A. Wonfor, I. H. White and R. V. Penty, "Chasing errors through the network stack: a testbed for investigating errors in real traffic on optical networks," in IEEE Communications Magazine, vol. 43, No. 8, pp. S34-S39, Aug. 2005, doi: 10.1109/MCOM.2005.1497554. (Year: 2005).*

* cited by examiner

TEST DEVICE AND METHOD WITH BUILT-IN SELF-TEST LOGIC

TECHNICAL FIELD

The present invention generally relates to the field of electronic communication technology, and more particularly to a test device and method with built-in self-test logic.

BACKGROUND

With the increase in port speed of communication device, it requires a very high signal transmission speed between physical layer and medium access control layer in the communication device. After the high-speed serial electrical signal transmits a certain distance in the communication device, high-frequency components of the signal will be attenuated. The higher the transmission speed of the signal, the greater the attenuation rate of the high-frequency components. The reduction of high-frequency components will cause inter-symbol interference, which in turn will generate bit errors and affect the accuracy of data. The current test method requires a bit error test device and an external PCIe endpoint card to test the data in the communication device. This test method needs to rely on a third-party endpoint card.

SUMMARY OF THE INVENTION

The object of the present invention is to provide a test device and method with built-in self-test logic to locate a fault in a physical layer or a medium access control layer.

The present application discloses a test device with built-in self-test logic, comprising at least one generator and at least one checker disposed between a physical layer and a medium access control layer, wherein, the at least one generator is configured to generate a protocol pattern to form a data path between the physical layer and the medium access control layer, and generate different pseudo random bit sequence patterns in the data path;

the at least one checker is configured to test data stream in the physical layer and/or the medium access control layer according to the pseudo random bit sequence patterns, thereby locating a fault position.

In a preferred example, each of the generators comprises a protocol pattern generator, a pseudo random bit sequence pattern generator and a multiplexer, wherein output ends of the protocol pattern generator and the pseudo random bit sequence pattern generator are coupled to input ends of the multiplexer respectively.

In a preferred example, each of the checkers comprises a protocol pattern checker, a pseudo random bit sequence pattern checker and a demultiplexer, wherein output ends of the demultiplexer are coupled to the protocol pattern checker and the pseudo random bit sequence pattern checker.

In a preferred example, the test device further comprises a first logic circuit, wherein input ends of the first logic circuit are coupled to the physical layer and the generator, and an output end of the first logic circuit is coupled to the medium access control layer.

In a preferred example, the test device further comprises a second logic circuit, wherein input ends of the second logic circuit are coupled to the medium access control layer and the generator, and an output end of the second logic circuit is coupled to the physical layer.

In a preferred example, the at least one checker tests bit error rate of the data stream.

In a preferred example, the physical layer comprises a serializer and a deserializer, wherein the serializer is configured to convert parallel data into serial data, and the deserializer is configured to convert serial data to parallel data.

This application also discloses a test method with built-in self-test logic, comprising:

generating a protocol pattern by one of at least one generator to form a data path between a physical layer and a medium access control layer;

generating pseudo random bit sequence patterns in the data path by the generator;

locking the pseudo random bit sequence patterns through each of at least one checker, and testing data stream in the physical layer and/or the medium access control layer; and locating a fault position according to results of each test in the at least one checker.

In a preferred example, each of the generators comprises a protocol pattern generator, a pseudo random bit sequence pattern generator and a multiplexer, wherein output ends of the protocol pattern generator and the pseudo random bit sequence pattern generator are coupled to the multiplexer.

In a preferred example, each of the checkers comprises a protocol pattern checker, a pseudo random bit sequence pattern checker and a demultiplexer, wherein output ends of the demultiplexer are coupled to the protocol pattern checker and the pseudo random bit sequence pattern checker.

In a preferred example, the at least one checker tests bit error rate of the data stream.

The present application also discloses a communication device, comprising a physical layer, a medium access control layer, a processor and a computer-readable storage medium, wherein the computer readable storage medium stores computer executable commands, when executed by the processor the computer executable commands cause the processor to:

generate a protocol pattern by one of at least one generator to form a data path between the physical layer and the medium access control layer;

generate pseudo random bit sequence patterns in the data path by the generator;

lock the pseudo random bit sequence patterns through each of at least one checker, and test data stream in the physical layer and/or the medium access control layer; and locate a fault position according to results of each test in the at least one checker.

In a preferred example, each of the generators comprises a protocol pattern generator, a pseudo random bit sequence pattern generator and a multiplexer, wherein output ends of the protocol pattern generator and the pseudo random bit sequence pattern generator are coupled to the multiplexer.

In a preferred example, each of the checkers comprises a protocol pattern checker, a pseudo random bit sequence pattern checker and a demultiplexer, wherein output ends of the demultiplexer are coupled to the protocol pattern checker and the pseudo random bit sequence pattern checker.

In a preferred example, the at least one checker tests bit error rate of the data stream.

In the test device with built-in self-test logic of the present application, the built-in self-test logic is PCIe protocol-aware, which supports a configurable protocol pattern. The present application completely covers the high-speed data path of the retimer, does not require an external endpoint test card or test instruments, and is friendly to automated test equipment and experimental debugging.

BRIEF DESCRIPTION OF THE DRAWINGS

Non-limiting and non-exhaustive embodiments of the present application are described with reference to the following drawings, where like reference numerals refer to like parts throughout the various views unless otherwise specified.

DETAILED DESCRIPTION

Various aspects and examples of the present application will now be described. The following description provides specific details for a thorough understanding and enabling description of these examples. Those skilled in the art will understand, however, that the disclosure may be practiced without many of these details.

Additionally, some well-known structures or functions may not be shown or described in detail, so as to avoid unnecessarily obscuring the relevant description.

The terminology used in the description presented below is intended to be interpreted in its broadest reasonable manner, even though it is being used in conjunction with a detailed description of certain specific examples. Certain terms may even be emphasized below, however, any terminology intended to be interpreted in any restricted manner will be overtly and specifically defined as such in this Detailed Description section.

Figure 1:
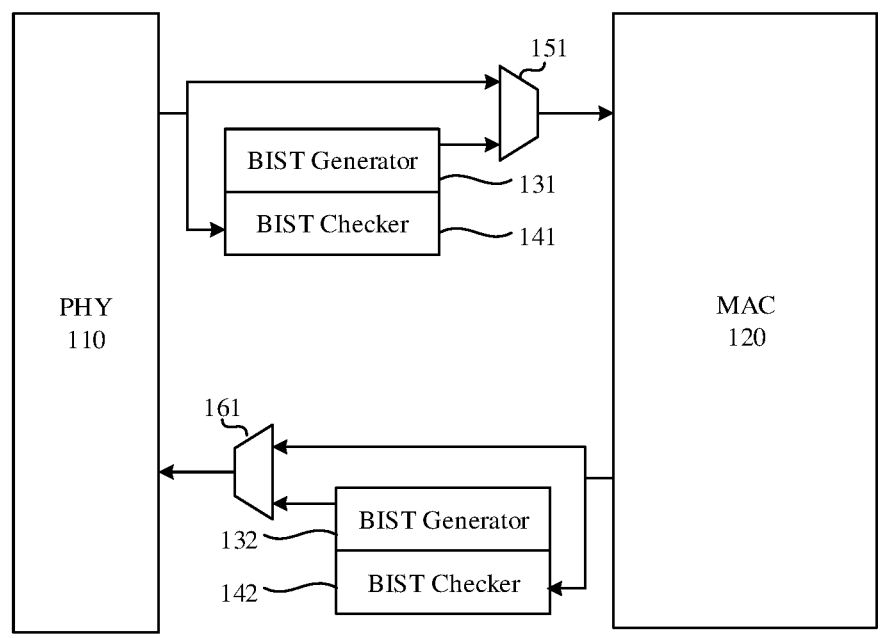
FIG. 1 is a schematic diagram of a test device according to an embodiment of the present application.

An embodiment of the present application discloses a test device with built-in self-test logic. A block diagram of the test device is shown in FIG. 1. The test device comprises at least one generator 131,132 and at least one checker 141,142 between a physical layer (PHY) 110 and a media access control layer (MAC) 120. The at least one generator 131, 132 is configured to generate a protocol pattern to form a data path (not shown in FIG. 1) between the physical layer 110 and the medium access control layer 120 and generate different pseudo random bit sequence patterns in the data path. The at least one checker 141, 142 is configured to test the data stream in the physical layer 110 and/or the medium access control layer 120 according to the pseudo random bit sequence patterns, thereby locating the fault position.

In an embodiment, the test device further comprises a first logic circuit 151, input ends of the first logic circuit 151 are coupled to the physical layer 110 and the generator 131, and an output end of the first logic circuit 151 is coupled to the medium access control layer 120. The first logic circuit 151 enables gating between the media access control layer 120 and the physical layer 110 or the generator 131. The first logic circuit 151 is not an essential component in this embodiment. In other embodiments of the present application, the media access control layer 120 can be directly coupled to the physical layer 110 and the generator 131 without passing through the first logic circuit 151 as a connection interface.

In an embodiment, the test device further comprises a second logic circuit 161, input ends of the second logic circuit 161 are coupled to the medium access control layer 120 and the generator 132, and an output end of the second logic circuit 161 is coupled to the physical layer 110. The second logic circuit 161 enables gating between the physical layer 110 and the medium access control layer 120 or the generator 132. The second logic circuit 161 is not an essential component in this embodiment. In other embodiments of the present application, the physical layer 110 may be directly coupled to the media access control layer 120 and the generator 132 without passing through the second logic circuit 161 as a connection interface.

In this embodiment, one or more generators and one or more checkers constitute built-in self-test (BIST) logic. The first logic circuit and the second logic circuit enable gating among the physical layer, the medium access control layer and the built-in self-test logic, realizing switching between a normal data transmission mode and a test mode of the test device. The built-in self-test logic may be protocol-aware, preferably, PCIe protocol-aware.

In an embodiment, the physical layer 110 comprises a serializer and a deserializer (not shown in FIG. 1), the serializer is configured to convert parallel data to serial data, and the deserializer is configured to convert serial data to parallel data. For example, the physical layer 110 comprises a SerDes to implement the functions of the serializer and the deserializer.

Figure 2:
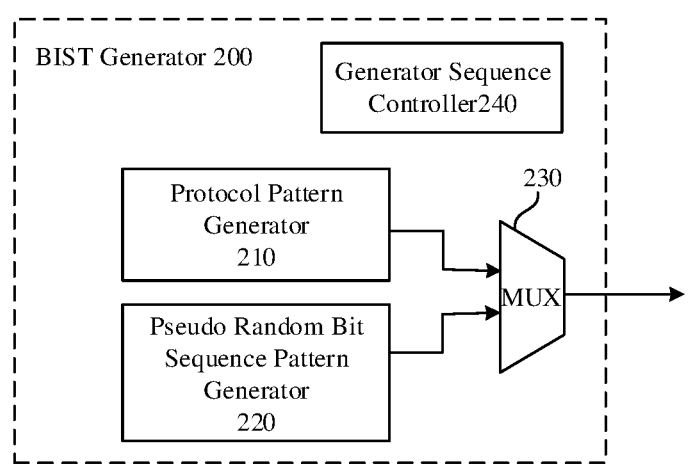
FIG. 2 is a schematic diagram of a generator according to an embodiment of the present application.

FIG. 2 shows a schematic diagram of the generator in an embodiment of the present application, wherein the BIST generator 200 may be, for example, the generator 131 or 132 in FIG. 1. The generator 200 comprises a protocol pattern generator 210, a pseudo random bit sequence pattern generator 220, a multiplexer (MUX) 230 and a generator sequence controller 240, wherein output ends of the protocol pattern generator 210 and the pseudo random bit sequence pattern generator 220 are coupled to input ends of the multiplexer 230, respectively. The generator sequence controller 240 is used to implement the register configuration in the generator 200 of the BIST before generating a protocol pattern. Methods for configuring the register(s) may be implemented by any configuration methods that are known or future known and will not be repeated here.

Figure 3:
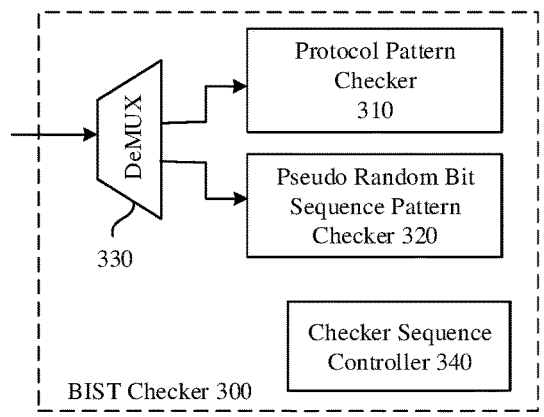
FIG. 3 is a schematic diagram of a checker according to an embodiment of the present application.

FIG. 3 shows a schematic diagram of the checker in an embodiment of the present application, wherein the BIST checker 300 may be, for example, the checker 141 or 142 in FIG. 1. The checker 300 comprises a protocol pattern checker 310, a pseudo random bit sequence pattern checker 320, a demultiplexer (DeMUX) 330 and a checker sequence controller 340, wherein output ends of the demultiplexer 330 are respectively coupled to the protocol pattern checker 310 and the pseudo random bit sequence pattern checker 320. The checker sequence controller 340 is used to implement register configuration in the checker 300 of the BIST before generating a protocol pattern. Methods for configuring the register(s) may be implemented by any configuration methods that are known or future known and will not be repeated here.

It should be understood that the multiplexer (MUX) and the demultiplexer (DeMUX) in this embodiment are both existing technologies that are well known to those skilled in the art and will not be repeated here.

In an embodiment, the pseudo random bit sequence pattern may be one of PRBS7, PRBS15, PRBS23 and PRBS31. In this embodiment, different pseudo random bit sequence patterns are selected to implement user-definable patterns and error injection.

In an embodiment, the at least one checker 141, 142 tests bit error rate of the data stream in the physical layer 110 and/or the medium access control layer 120, and outputs the bit error rate. Analyze the bit error rates of each checker 141, 142 to locate the fault position.

Specifically, when the generator generates the protocol pattern, the protocol pattern checker in the checker may be used to test the protocol pattern, and a data path between the physical layer and the media access control layer is formed, which can also realize the function pattern test of the physical layer and the medium access control layer. When the generator generates a pseudo random bit sequence pattern, the pseudo random bit sequence pattern checker in the checker performs verification according to the pseudo random bit sequence pattern, and measures the corresponding bit error rate.

In an embodiment of the present application, the test may be implemented by the checker according to the bit error rate. In other embodiments of the present application, the test may be implemented by the checker using a cyclic redundancy (CRC) check code.

In this embodiment, a test loop is formed between the physical layer and the medium access control layer. The physical layer serves as an output end and an input end of the medium access control layer respectively, the medium access control layer serves as an output end and an input end of the physical layer respectively, thereby fault position at the output end and the input end of the physical layer and the media access control layer can be located.

Figure 4:
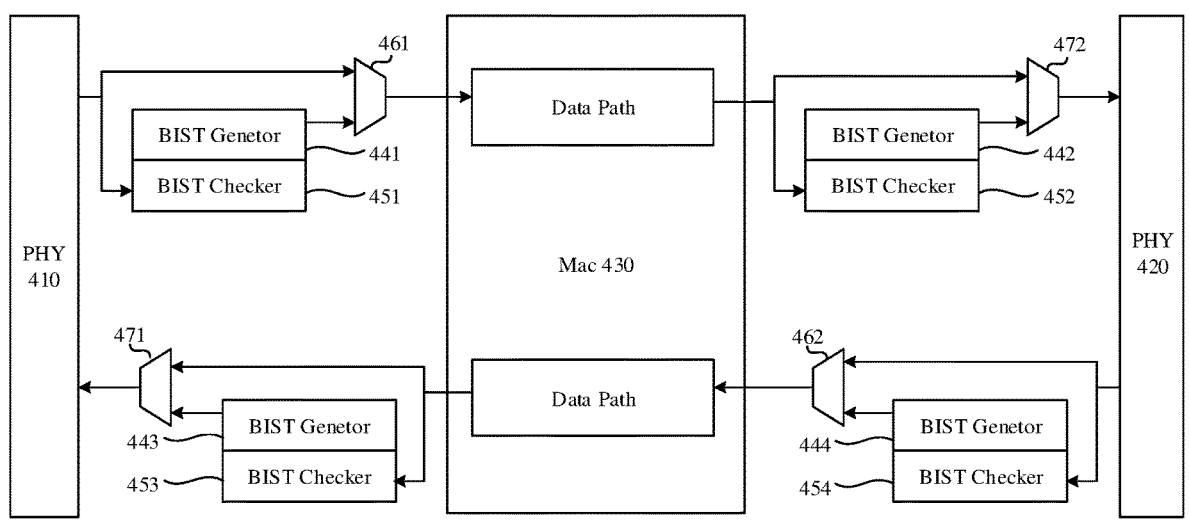
FIG. 4 is a schematic diagram of a test device according to another embodiment of the present application.

A test device in another embodiment of the present application is shown in FIG. 4. FIG. 4 shows that the test device comprises physical layers (PHYs) 410,420 and a medium access control layer 430. The test device comprises at least one generator 441,442,443,444 and at least one checker 451,452,453,454 which are disposed between the physical layers 410,420 and the medium access control layer 430. The at least one generator 441, 442, 443, 444 is configured to generate a protocol pattern to form a data path between the physical layer 410 or 420 and the medium access control layer 430 and generate different pseudo random bit sequence patterns in the data path, wherein the at least one generator 441, 442, 443, 444 may be the generator 200 as shown in FIG. 2 and will not be repeated here. The at least one checker 451,452,453,454 is configured to test data stream in the physical layer 410,420 and/or the medium access control layer 430 according to the pseudo random bit sequence pattern, thereby locating the fault position, the at least one checker 451,452,453,454 may be the checker 300 as shown in FIG. 3, and will not be repeated here.

In an embodiment, the test device further comprises first logic circuits 461,462, input ends of the first logic circuits 461,462 are coupled to the physical layer 410,420 and the generators 441,444, and output ends of the first logic circuits 461,462 are coupled to the medium access control layer 430.

In an embodiment, the test device further comprises second logic circuits 471, 472, and the medium access control layer 430 and the generators 442, 443 are coupled to input ends of the second logic circuits 471, 472, and output ends of the second logic circuits 471, 472 are coupled to the physical layer 410,420.

Figure 5:
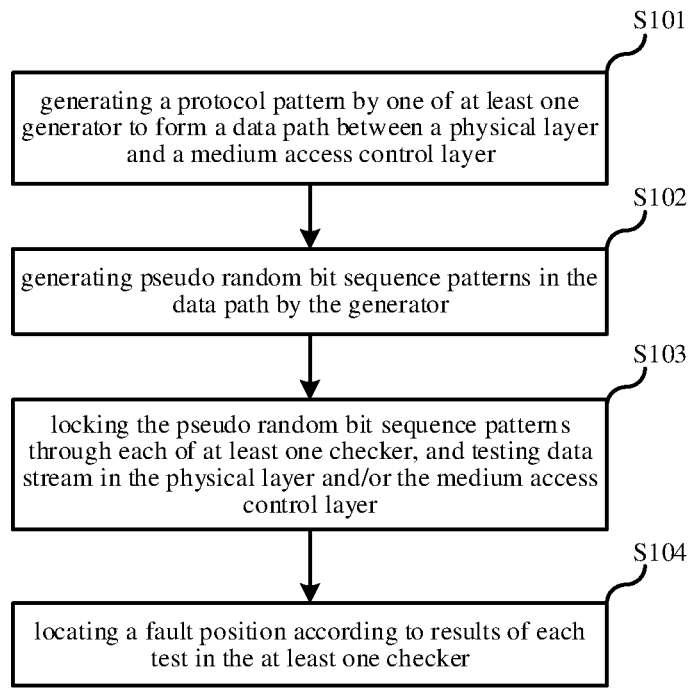
FIG. 5 is a flow chart of a test method according to an embodiment of the present application.

Another embodiment of the present application also discloses a test method with built-in self-test logic. The flow chart of the test method is shown in FIG. 5. The test method comprises:

Step S101, generating a protocol pattern by one of at least one generator to form a data path between a physical layer and a medium access control layer;

Step S102, generating a pseudo random bit sequence pattern in the data path by the generator;

Step S103, locking the pseudo random bit sequence pattern through each of at least one checker, and testing bit error rate of data stream in the physical layer and/or the medium access control layer;

Step S104, locating a fault position according to the bit error rate measured by each of the at least one checker.

In an embodiment, each of the generators comprises a protocol pattern generator, a pseudo random bit sequence pattern generator and a multiplexer, wherein output ends of the protocol pattern generator and the pseudo random bit sequence pattern generator are coupled to the multiplexer.

In an embodiment, each of the checkers comprises a protocol pattern checker, a pseudo random bit sequence pattern checker and a demultiplexer, wherein output ends of the demultiplexer are coupled to the protocol pattern checker and the pseudo random bit sequence pattern checker.

In this application, a protocol pattern is firstly generated between the physical layer and the media access control layer to enter the normal data transmission mode, and a data path is formed between the physical layer and the media access control layer. After that, different pseudo random bit sequence patterns are generated in the data path to enter the test mode, and at least one checker verifies the data stream in the data path, such as tests the bit error rate of the data stream, and analyzes the bit error rate measured by each checker, and locates the fault position when the physical layer or medium access control layer servers as the output end or input end respectively.

Figure 6:
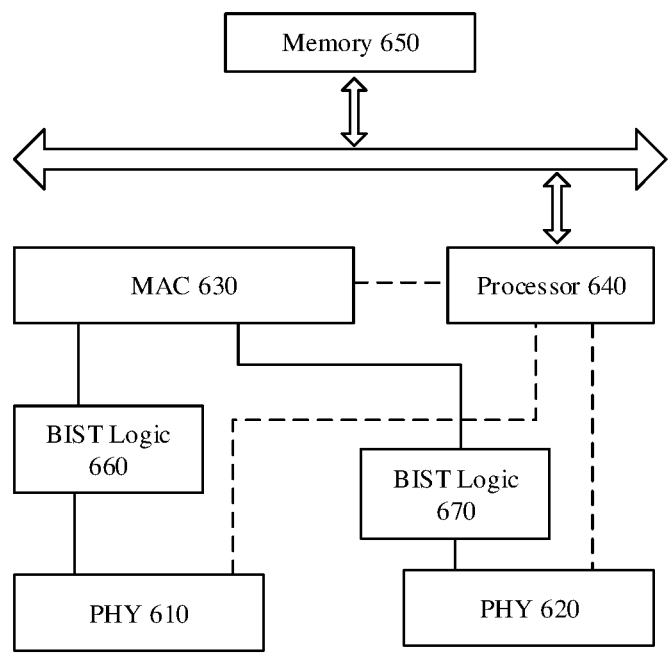
FIG. 6 is a schematic diagram of a communication device in an embodiment of the present application.

Another embodiment of the present application also discloses a communication device. FIG. 6 shows a block diagram of the communication device in this embodiment. The communication device comprises physical layers 610, 620, a medium access control layer 630, a processor 640 and a computer-readable storage medium 650. Furthermore, BIST logics 660, 670 are disposed between the physical layers 610, 620 and the media access control layer 630. The BIST logics 660, 670 comprise one or more generators and/or one or more checkers in the embodiments of this application, the storage medium 650 stores computer-executable instructions which are executed by the processor to implement each embodiment of this specification. The processor and the storage medium are coupled by a data bus.

The computer-readable storage media comprises volatile and non-volatile, removable and non-removable storage media which can store information by any method or technology. The information may be modules of computer readable instructions, data structures and programs or other data. Examples of the computer storage media comprises, but not limited to, phase change memory (PCM), static random access memory (SRAM), dynamic random access memory (DRAM) or other types of random access memory (RAM), read-only memory (ROM), electrically erasable programmable read-only memory (EEPROM), flash memory or other memory technologies, read-only compact disc read-only memory (CD-ROM), digital versatile disc (DVD) or other optical storage, magnetic tape cassettes, magnetic tape magnetic disk storage or other magnetic storage devices or any other non-transmission media can be used to store information that can be accessed by computing devices. According to the definition herein, the computer-readable storage media do not comprise temporary storage computer-readable media (transitory media), such as modulated data signals and carrier waves.

It should be noted that in present application, relational terms such as "first" and "second", etc. are only used to distinguish one entity or operation from another entity or operation, and do not necessarily require or imply any such actual relationship or order between these entities or operations. Furthermore, the term "comprises" or "comprising" or "includes" or any other variations thereof is intended to encompass a non-exclusive inclusion, such that a process, method, article, or device that comprises a plurality of elements includes not only those elements but also other elements, or elements that are inherent to such a process, method, item, or device. An element that is defined by the phrase "comprising a" does not exclude the presence of the same element in the process, method, item, or device that comprises the element. In the present application, if it is mentioned that an action is performed according to an element, it means the meaning of performing the action at least according to the element, and includes two cases: the behavior is performed only on the basis of the element, and the behavior is performed based on the element and other elements. Multiple, a plurality of, various, etc. expressions include 2, twice, 2 types, and 2 or more, twice or more, and 2 types or more types.

All documents mentioned in this specification are considered to be included in the disclosure content of this application as a whole, so that they can be used as a basis for modification when necessary. In addition, it should be understood that the above description is only preferred embodiments of the present application and is not intended to limit the protection scope of the present specification. Any modification, equivalent replacement, improvement, etc. within the spirit and principle of one or more embodiments of this specification should be included in the protection scope of one or more embodiments of this specification.

In some cases, the actions or steps recited in the claims may be performed in a different order than in the embodiments and still achieve the desired results. In addition, the processes depicted in the drawings do not necessarily require the particular order shown or sequential order to achieve the desired results. In some embodiments, multi-tasking and parallel processing are also possible or may be advantageous.

What is claimed is:

1. A test device with built-in self-test logic, the test device comprising:
   a plurality of generators and a plurality of checkers that are respectively disposed in pairs between two physical layers and a medium access control layer, wherein:
   the generator of each pair is configured to generate a protocol pattern to form a data path among the physical layers and the medium access control layer, and generate different pseudo random bit sequence patterns in the data path;
   the checker of each pair is configured to (i) lock the pseudo random bit sequence patterns, (ii) test a data stream received from the corresponding physical layer or the medium access control layer according to the pseudo random bit sequence patterns, and (iii) output a bit error rate;
   the two physical layers serve as output ends and input ends of the medium access control layer respectively, and the medium access control layer serves as an output end and an input end of each physical layer of the two physical layers; and
   a fault position is located according to analysis of the outputted bit error rate.

2. The test device according to claim 1, wherein each of the plurality of generators includes a protocol pattern generator, a pseudo random bit sequence pattern generator, and a multiplexer, wherein output ends of the protocol pattern generator and the pseudo random bit sequence pattern generator are coupled to input ends of the multiplexer respectively.

3. The test device according to claim 1, wherein each of the plurality of checkers includes a protocol pattern checker, a pseudo random bit sequence pattern checker, and a demultiplexer, wherein output ends of the demultiplexer are coupled to the protocol pattern checker and the pseudo random bit sequence pattern checker.

4. The test device according to claim 1, further comprising a first logic circuit, wherein input ends of the first logic circuit are coupled to one of the two physical layers and the generator, and an output end of the first logic circuit is coupled to the medium access control layer.

5. The test device according to claim 1, further comprising a second logic circuit, wherein input ends of the second logic circuit are coupled to the medium access control layer and the generator, and an output end of the second logic circuit is coupled to one of the two physical layers.

6. The test device according to claim 1, wherein each of the two physical layers include a serializer and a deserializer, wherein the serializer is configured to convert parallel data into serial data, and the deserializer is configured to convert serial data to parallel data.

7. A test method with built-in self-test logic, the test method comprising:
   generating a protocol pattern by one of a plurality of generators to form a data path among two physical layers and a medium access control layer;
   generating pseudo random bit sequence patterns in the data path by the generator;
   locking the pseudo random bit sequence patterns, and testing a data stream received from the corresponding physical layer or the medium access control layer, and outputting a bit error rate by each of a plurality of checkers; and
   locating a fault position according to results of each test in the plurality of checkers and analysis of the outputted bit error rate, the two physical layers serve as output ends and input ends of the medium access control layer respectively, and the medium access control layer serves as an output end and an input end of each physical layer of the two physical layers.

8. The test method according to claim 7, wherein each of the plurality of generators include a protocol pattern generator, a pseudo random bit sequence pattern generator, and a multiplexer, and output ends of the protocol pattern generator and the pseudo random bit sequence pattern generator are coupled to the multiplexer.

9. The test method according to claim 7, wherein each of the plurality of checkers includes a protocol pattern checker, a pseudo random bit sequence pattern checker, and a demultiplexer, and output ends of the demultiplexer are coupled to the protocol pattern checker and the pseudo random bit sequence pattern checker.

10. A communication device comprising a physical layer, a medium access control layer, a test device with built-in self-test logic, a processor, and a non-transitory computer-readable storage medium, wherein the test device includes a plurality of generators and a plurality of checkers that are disposed in pairs between two physical layers and a medium access control layer, and wherein the non-transitory computer readable storage medium stores computer executable commands, which when executed by the processor, the computer executable commands cause the processor to:

generate a protocol pattern by one of a plurality of generators to form a data path among the two physical layers and the medium access control layer;

generate pseudo random bit sequence patterns in the data path by the generator;

lock the pseudo random bit sequence checker, patterns, and test a data stream in the received from the corresponding physical layer or the medium access control layer, and output a bit error rate by each of a plurality of checkers; and locate a fault position according to results of each test in the plurality of checkers and analysis of the outputted bit error rate, the two physical layers serve as output ends and input ends of the medium access control layer respectively, and the medium access control layer serves as an output end and an input end of each physical layer of the two physical layers.

11. The communication device according to claim 10, wherein each of the plurality of generators includes a protocol pattern generator, a pseudo random bit sequence pattern generator, and a multiplexer, and output ends of the protocol pattern generator and the pseudo random bit sequence pattern generator are coupled to the multiplexer.

12. The communication device according to claim 10, wherein each of the plurality of checkers includes a protocol pattern checker, a pseudo random bit sequence pattern checker, and a demultiplexer, and output ends of the demultiplexer are coupled to the protocol pattern checker and the pseudo random bit sequence pattern checker.

\* \* \* \* \*